United States Patent [19]
Fisher et al.

[11] Patent Number: 5,757,294
[45] Date of Patent: May 26, 1998

[54] RATE 24/25 MODULATION CODE FOR PRML RECORDING CHANNELS

[75] Inventors: Kevin D. Fisher, Palo Alto; James Fitzpatrick, Los Altos, both of Calif.

[73] Assignee: Quantum Corporation, Milpitas, Calif.

[21] Appl. No.: 774,412

[22] Filed: Dec. 31, 1996

[51] Int. Cl.⁶ ........................................ H03M 7/00
[52] U.S. Cl. ........................................ 341/57; 341/58
[58] Field of Search ........................... 341/58, 59, 95

[56] References Cited

U.S. PATENT DOCUMENTS

| | | | |
|---|---|---|---|
| 5,260,703 | 11/1993 | Nguyen et al. | 341/100 |
| 5,291,500 | 3/1994 | Patel et al. | 371/65 |
| 5,304,997 | 4/1994 | Konno | 341/95 |
| 5,321,397 | 6/1994 | Stone | 341/59 |
| 5,349,349 | 9/1994 | Shimizume | 341/58 |
| 5,635,933 | 6/1997 | Fitzpatrick et al. | 341/58 |
| 5,668,545 | 9/1997 | Chen | 341/50 |

*Primary Examiner*—Marc S. Hoff
*Attorney, Agent, or Firm*—Micah D. Stolowitz; Debra A. Chun

[57] ABSTRACT

Rate 24/25 modulation encoding methods and apparatus improve efficiency in a PRML magnetic recording channel. The rate 24/25 code word uses rate 8/9 RLL encoding of one byte of user data, combined with interleaved unencoded bytes to achieve improved code rates with reasonable global run length constraint. Use of the the rate 8/9 RLL (0.3) subcode results in a rate 24/25 RLL (0,11) code, while a rate 8/9 (0,6/5) subcode results in a rate 24/25 RLL (0,14/13) code.

21 Claims, 3 Drawing Sheets

RATE 24/25 MODULATION CODE FOR PRML RECORDING CHANNELS

FIELD OF THE INVENTION

The present invention relates to channel modulation codes and methods for implementation in magnetic recording systems such as disk drives. More specifically, the present invention relates to a rate 24/25 run-length limited (RLL) modulation code for use in a PRML channel.

BACKGROUND OF THE INVETION

Modulation codes are used in magnetic recording channels in order to limit recorded bit sequences to those that are most reliably detectable. In particular, run length limited (RLL) modulation codes have been used within partial response signaling, maximum likelihood detection (PRML) data recording and playback channels, decision feedback equalization (DFE).channels, and the like. Partial response systems of interest for magnetic data storage devices such as disk drives and magnetic tape include a PR4 $(1-D^2)$ channel and EPR4 $(1+D-D^2-D^3)$ channel as well as other nonclassical polynomials. The present invention will be described below in the context of a PR4 channel, although its applications are not limited to that specific implementation.

In general, these systems employ Viterbi detectors to achieve maximum likelihood detection of user data as it is played back from the recording medium. A modulation code for a PRML data recording and playback channel is selected to balance code efficiency against timing/gain loop reliability and the Viterbi detector path memory, as well as error propagation during decoding.

Run length limited modulation codes are often described using the format "(rate) RLL (d,G/I)" where the "rate" is expressed as a ratio of the number of input bits to be encoded to the number of output bits in the resulting codeword. For example, a rate 8/9 modulation code converts an 8-bit input byte into a 9-bit codeword, as further explained later. Rate 8/9 encoding is well known in the art, as described, for example, in U.S. Pat. No. 4,707,681 and U.S. Pat. No. 5,260,703 both incorporated herein by this reference. As the code rate approaches unity, the code is deemed to be more efficient, in that relatively fewer code characters are required to encode user data values. Thus, a rate 8/9 code is more efficient than a rate 2/3 code.

Similarly, a rate 16/17 code is more efficient than a rate 8/9 code. A rate 16/17 code (=0.941) achieves an approximately 6% increase in recording density over a standard rate 8/9 modulation code. One example of an improved rate 16/17 modulation code is described in commonly assigned U.S. patent application Ser. No. 08/497,182, filed Jun. 30, 1995, and incorporated herein by this reference. Additionally, a "bit-interleaved rate 16/17 modulation code with three-way byteinterleaved ECC" is disclosed in commonly assigned U.S. patent application Ser. No. 08/518,945, filed Aug. 24, 1995, and also incorporated herein by reference.

Returning to the nomenclature introduced above, the letters RLL of course stand for "run length limited" indicating that the code imposes limitations on the length of a "run" or uninterrupted series of zero bits as further explained later. The parenthetical numbers describe the restrictions on transitions for a given code as follows. In a (0,4/4) code, for example, the 0 indicates no fewer than 0 zeros between ones in the codeword. The first 4, called the global run length constraint, requires that there be no more than four consecutive zeros between ones in the codeword. The letter "G" is an abbreviation for the global run length constraint. The second numeral 4 in the example is an interleave constraint, requiring that there be no more than four consecutive zeros before a one in either the odd or even interleaves. The letter "I" is an abbreviation for the interleave constraint.

Early PRML read channels used the well-known rate 8/9 RLL(0,4/4) channel code. In accordance with prior art, this channel code is combined with a 1/(1+D 2) modulo 2 precoder to obtain the {+1,−1} valued magnetic write-current pattern. On the decoder side, the signal is first equalized (to the partial response target) and then the +1/−1 write-current waveform is maximum-likelihood detected. The write current is then "unprecoded" (or postcoded) with a 1+D 2 modulo 2 function. This "undoes" the precoding to regenerate a {0,1} valued sequence. The data is then RLL decoded for the user. Examples of RLL encoders and decoders are disclosed in the patents identified above.

The "G" constraint in channel encoding is required in order to prevent long strings of no-transitions on the magnetic media. This is important primarily for timing and gain recovery, and has secondary impact on the magnetic "overwrite" ability (related to the ratio between the maximum and minimum recorded frequency). The "I" constraint is sometimes required so that the Viterbi Detector (VD) path memory will remerge within a controlled amount of time. This impacts VD memory length and error event length. The "I" constraint is particularly important in PR4 (and EPR4) channels, as minimum distance error events can sometimes occur in a single interleave and can be arbitrarily long without such a constraint. If arbitrarily-long minimum-distance error events in a single interleave are not possible for a given choice of partial-response channel polynomial, then the "I" constraint could be eliminated. This would enable a tighter "G" constraint in the code. If the interleave constraint is removed, then 1/(1+D) precoding may be used. This may be appropriate for decision-feedback equalization (DFE) based systems, and other systems where long error events in a single interleave are not possible. If arbitrarily-long minimum-distance error events in a single interleave are possible for a given choice of partial-response target, then the "I" constraint should be included. Interleave constraints are further discussed later.

The rate 8/9 code can be extended to a rate 16/17 code by either bit-wise or byte-wise interleaving unencoded bytes with the encoded sequence. See commonly assigned U.S. patent application Ser. No. 08/497,182, filed Jun. 30, 1995, noted above. While the G and I constraints will become considerably larger (G=12, I=8 for byte-wise interleaved case), the roughly 6% in increased code rate is often considered worthwhile. Still, the need remains for improvements in recording channel encoding efficiency in order to improve storage capacities in recording systems and lower costs.

SUMMARY OF THE INVETION

In view of the foregoing background, a general object of the present invention is to improve the effective areal density of data recorded on a magnetic media.

Another object is to improve recording efficiency by reducing the relative amount of non-data bits or "overhead" in the data encoding process.

A further object of the invention is to provide a rate 24/25 modulation code having a reasonable zero run length limitation for use in magnetic recording and playback systems.

A more specific object is to provide a rate 24/25 modulation code which limits a single minimum distance error event at the input to the decoder to consequences at the output of the decoder approaching those of a conventional rate 8/9 (0.4/4) modulation code.

A further object of the present invention is to provide an encoding scheme having improved ratio of data bits to code word length without degrading run length limiting in encoded data.

Another object of the invention is to record data on a magnetic media so as to prevent long strings of no transitions on the magnetic media thereby allowing for reliable timing and gain recovery.

In one embodiment of the invention (using a specially designed rate 8/9 subcode), a rate 24/25 RLL (0,14/13) channel code for use in a PRML channel of a magnetic recording and playback system is disclosed to encode a series of user digital data bits for recording. The method includes first forming a series of 24 bits of user data. The next step is to rate 8/9 encode a first 8 bits of the series so as to form an encoded 9-bit codeword. A purposed designed rate 8/9 RLL (0,5/6) encoding is used for this step (described below). The resulting encoded 9-bit codeword is partitioned or divided into a first, 5-bit nibble and a second, 4-bit nibble, i.e. bits 8:4 and bits 3:0 respectively. We sequentially concatenate the first nibble, the second 8-bits of the user data bits, the second nibble, and the third 8-bits of user data, in that order, so as to form the new 25-bit codeword. In another embodiment of the invention, the interleave constraint is removed, and a rate 24/25 RLL (0,11) code can be implemented, using a (0,3) subcode as described in U.S. patent application Ser. No. 08/497,182 noted above. We will not further elaborate other possibilities, such as a 12/13 subcode making either 24/25 or 36/37 composite code.

The foregoing and other objects, features and advantages of the invention will become more readily apparent from the following detailed description of a preferred embodiment of the invention which proceeds with reference to the accompanying drawings.

DETAILED DESCRIPTION OF A PREFERRED EMBODIMENT

System Overview

Figure 1:
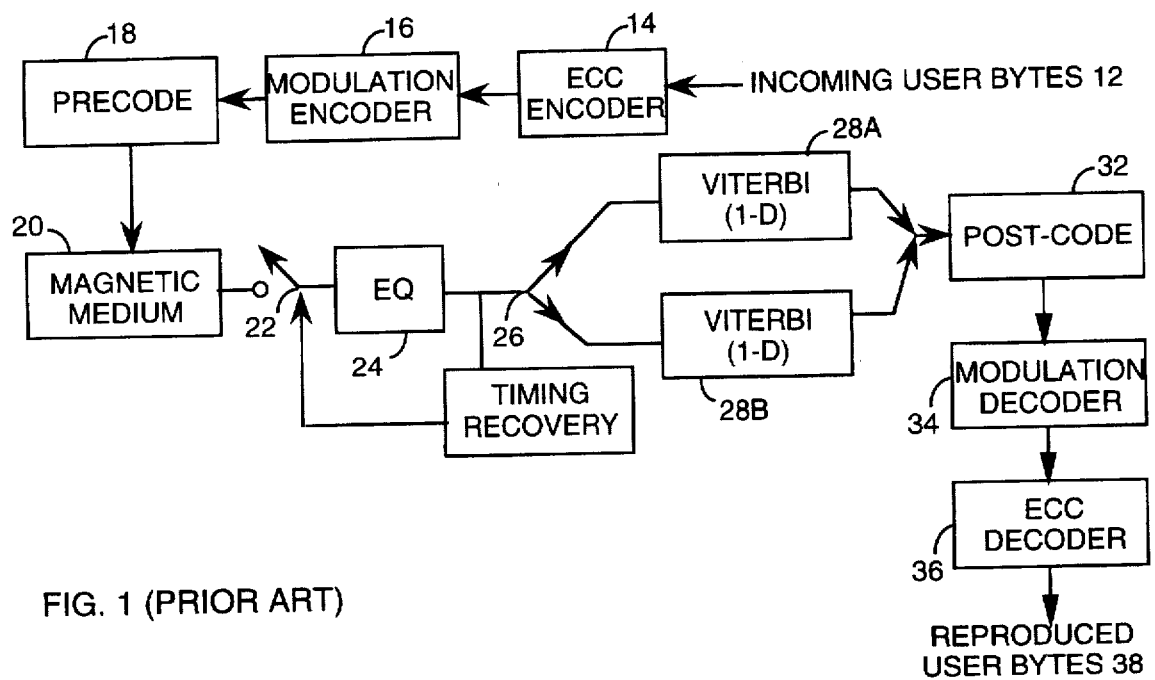
FIG. 1 is a block diagram showing the general arrangement of a conventional PRML magnetic media recording and playback system using dual-channel Viterbi detectors.

FIG. 1 is a simplified block diagram illustrating the general arrangement of a conventional PRML magnetic recording and playback system of the type used in disk drives. Briefly, in FIG. 1, a stream of incoming user bytes 12 is input to an ECC encoder 14 which appends parity bytes for each ECC interleave at the end of each data block. Each data block is then encoded in accordance with a desired modulation code, such as a rate 8/9 code by an encoder 16. (Other types of encoding are described below.) A precoder 18 then precodes the data in order to be compatible with a predetermined set of constraints. The blocks of data thus encoded and precoded are then recorded by digital saturation technology onto a magnetic storage medium 20 such as a rotating disk drive platter. This recording process is described in greater detail in various references known to those skilled in the art.

During playback, analog data is low-pass filtered and sampled by an A to D conversion process, illustrated as a switch 22 in FIG. 1. The sampled data is then equalized to the PR4 spectrum by analog and/or digital filtering 24. A selector 26 directs the equalized samples alternately to two Viterbi detectors 28A and 28B. The Viterbi detectors perform maximum likelihood detection of the interleaved sample sequences, and a downstream selector 30 reassembles the detected binary values into code words, which are then post-coded by post-coder 32, and decoded by a decoder 34. The post-coder 32 essentially reverses the preceding process (18) and the decoder 34 then reverses the encoding process (16). An ECC circuit 36 checks the data to see if any error bursts are present. If not, the decoded data bytes 38 are delivered to a requesting process. If one or more error bursts are detected, the ECC process undertakes a correction process not directly pertinent to the present invention.

Figure 2:
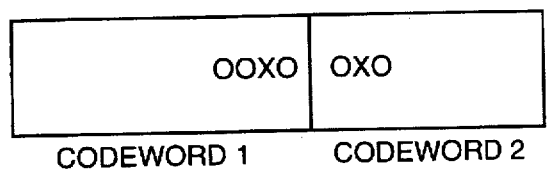
FIG. 2 is a graph illustrating a single error event propagated across multiple code words and ECC interleaves.

Since the Viterbi detectors 28A and 28B each include a path memory of predetermined length, every error event can corrupt more than one bit. With a standard PR4 preceding and a PR4 VITERBI detector 28A or 28B, one error event will corrupt 2 bits (after postcoding), separated by some span of up to I, for example 4, uncorrupted bits. When a bit becomes corrupted, for example by misdetection within the Viterbi detector, a whole code word becomes corrupted. And, if an error event happened to straddle a code word boundary, then two code words would become corrupted, as illustrated in FIG. 2, in which an X indicates a misdetected bit. One example of a prior art magnetic recording and playback channel is described in more detail in commonly assigned U.S. Pat. No. 5,341,249.

Figure 3:
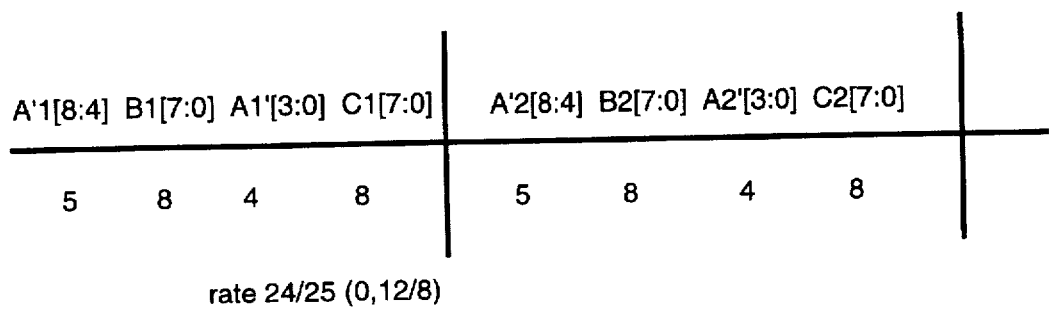
FIG. 3 illustrates new Rate 24/25 codewords according to the present invention.

FIG. 3 illustrates two rate 24/25 code words according to the present invention. The numbers below the line indicates numbers of bits (25 total per word), while the numbers above the line indicate the source of each group of bits. This graph will be more meaningful in light of a description of FIGS. 4 and 5, illustrating encode and decode paths, respectively.

Encode Path

Figure 4:
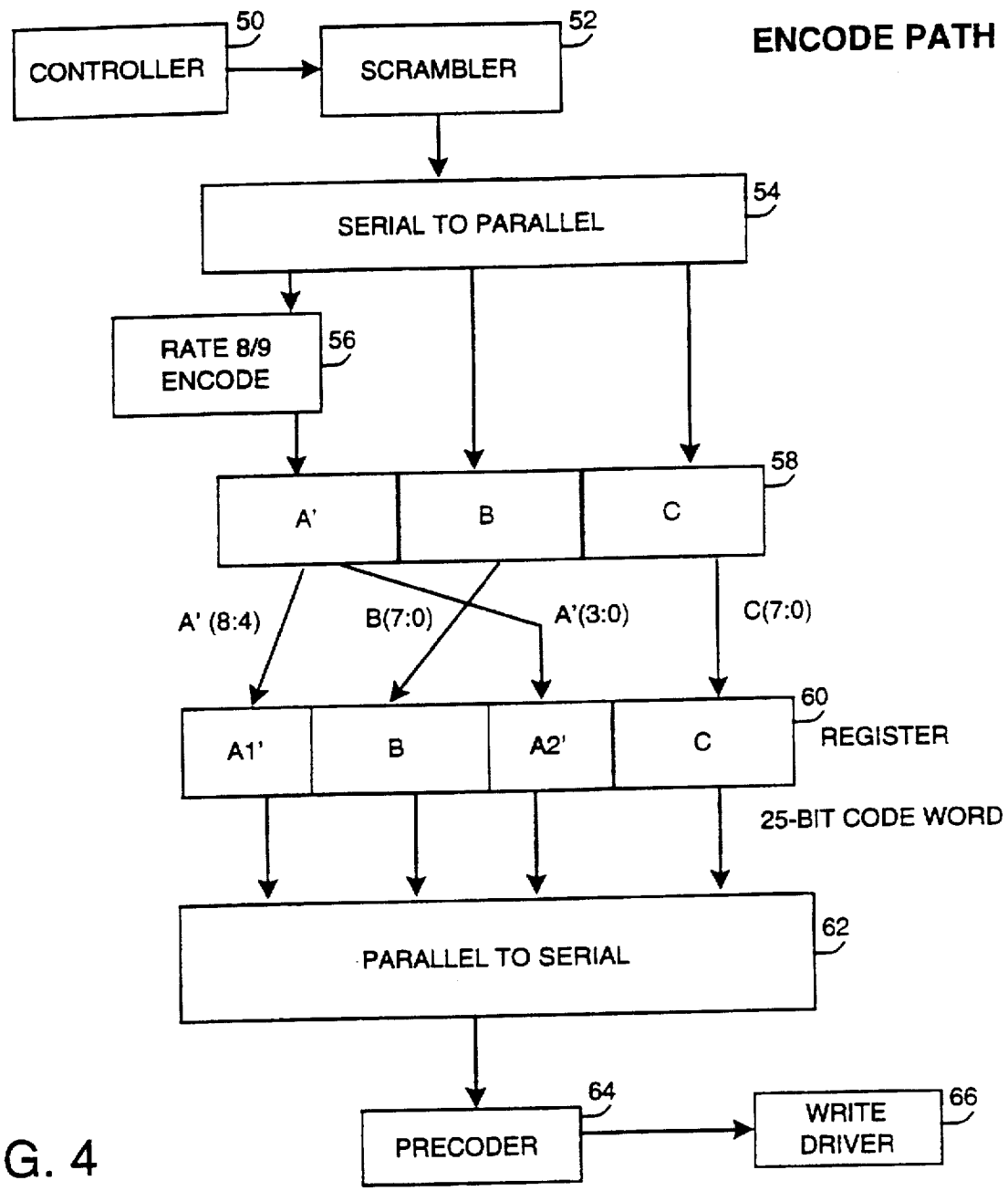
FIG. 4 is a simplified block diagram of an apparatus for encoding data according to the rate 24/25 RLL encoding of FIG. 3.
Figure 5:
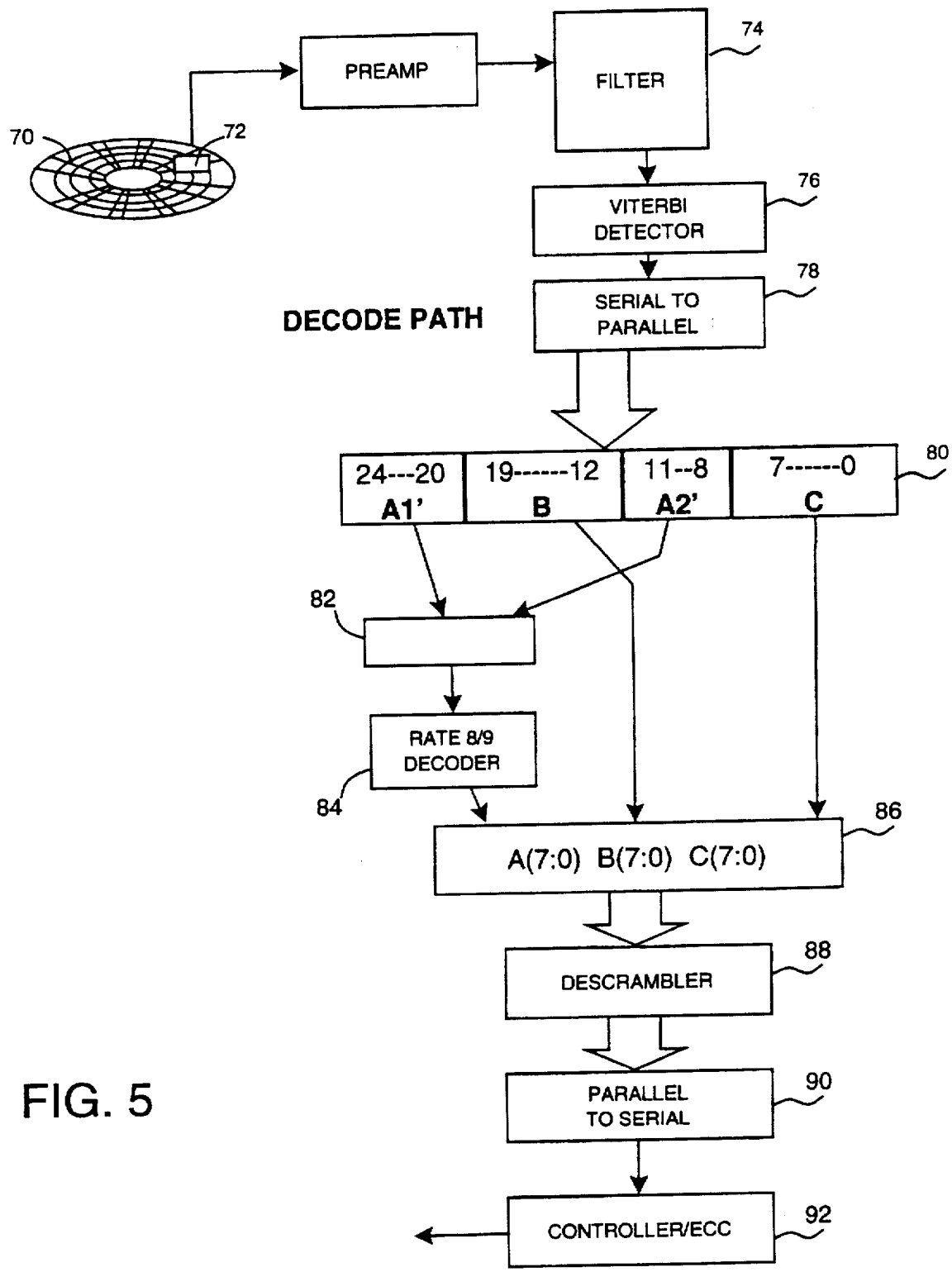
FIG. 5 is a simplified block diagram of apparatus for decoding rate 24/25 RLL encoded data.

FIG. 4 is a block diagram illustrating an example of an encoding path according to one aspect of the present invention. Referring to FIG. 4, a conventional controller 50 provides a stream of user input data to a scrambler circuit 52 for scrambling the sequence of user bytes. For illustration, we assume that each user byte consists of 8 bits. The data stream is input to a serial to parallel converter 54 which loads 3 bytes of user data, i.e., 24 bits, into a parallel word. A first byte A, is input to a rate 8/9 encoder 56 which encodes the byte so as to form a 9-bit encoded byte (A') as further discussed below. The 25-bit word illustrated as 58 consists of bytes A', B and C.

Next, this parallel data is loaded into a register 60 in the following manner. The high order nibble, i.e. A' bits 8:4, also called A1', is input to the high order 5-bit positions of register 60. Byte B is concatenated into the next 8 bit positions. The low-order nibble, A' bits 3:0 are concatenated into the next 4 bit positions of register 60, and finally, byte C forms the low order 8 bits in register 60. This new 25-bit quantity is input to a parallel-to-serial converter 62. The resulting serial stream of encoded data is input to a precoder 64 and then to write driver circuitry 66. Error correction (ECC) codes (not shown) can be implemented in conjunction with this system using methods known in the prior art.

To summarize, the method for generating a rate 24/25 channel code for use in a PRML channel comprises the steps of (a) forming a series of 24 bits of user data; (b) rate 8/9 encoding a first 8-bits of the series so as to form an encoded 9-bit code word; (c) partitioning the 9-bit code word into a high order 5-bit nibble and a low order 4-bit nibble; and (d) sequentially concatenating the high order nibble, the second byte of user data, the low order nibble, and the third byte of user data, in that order, so as to form the 25-bit code word. The resulting code word is then converted into a serial bit stream for recording in the conventional manner. This new technique that involves combining a rate 8/9 RLL code with unencoded bytes makes a rate 24/25 coding possible. This new code provides 2% and 8% improved code efficiency rates over rate 16/17 and rate 8/9 techniques, respectively. In one embodiment, the rate 8/9 encoding (56 in FIG. 4) is a RLL (0, 5/6) encoding, which is described below.

Code Properties

First we evaluate the case where no interleave constraint is required. Assume a rate 8/9 RLL(0,3) code (as referenced earlier). Because of the G=3 property of A', each of the nibbles A'[8:4] and A'[3:0] will have at least one transition. Because of the possibly all zero intervening bytes B and C, the new G constraint becomes 8+3=11. So in this case our new code is a rate 24/25 RLL (0,11) code.

Secondly, we examine the case where an interleave constraint is required. The purpose of the interleave constraint ("I") is to limit path memory depth and to eliminate very long minimum distance error events that can corrupt more than one byte per ECC interleave. This code is designed for a system with four ECC interleaves, however other embodiments are possible. In this case, we choose an underlying rate 8/9 code that has at least one transition in each interleave in the first 5-bit nibble of the code word, and at least one global transition in each nibble (a 5-bit and a 4-bit nibble). When the "I" constraint is included, we can provide a rate 8/9 (0,6/5) code (for encoding byte A) that is optimized for the runlength requirements of our new rate 24/25 code. This composite code now has runlength constraints (0,14/13). (With further code optimization, somewhat tighter I and G constraints may be possible, with some cost in encoder/decoder logic complexity.) This large runlength constraint would impact the Viterbi Detector path memory length (relative to a rate 8/9 or 16/17 code), however it would have the desireable property of limiting long minimum distance error events and increasing the code efficiency.

Implementation of the Rate 8/9 Encoding

As explained above, our rate 8/9 encoding must satisfy the following constraints: (a) There must be an interleave constraint in the first 5 bits of each codeword; and (b) there must be at least a single one in the last 4 bits of each word. One example of a modulation encoder that meets these criteria has the following logic equations:

TABLE 1

| Encoder Logic Equations |
|---|
| b0 = !x0 && ! x1 && !x2 && !x3; |
| e0 = !x4 && ! x5 && !x6 && !x7; |
| y0= !e0 && ( (!x0 && x2) + (x2 && !x3) + (x0 &&! x2) + (x0 && !x1) ); |
| y1 = !e0 && ( x0 + !x2 ); |

TABLE 1-continued

| Encoder Logic Equations |
|---|
| y2 = 20 + b0 + x1; |
| y3 = e0 + b0 + x2; |
| y4 = (e0 && !b0) + x3; |
| y5 = ((e0 && !b0) && x0) + x4; |
| y6 = ((e0 && !b0) && x1) + x5; |
| y7 = ((e0 && !b0) && x2) + x6; and |
| y8 = ((e0 && !b0) && x3) + x7 + (e0 && b0) | where x[7:0] is the said first byte of the input word, y[8:0] is the said 9-bit codeword, ! is the complement operator, && is the logic AND operator, and + is the boolean OR operator.

The Decode Path

FIG. 5 is a simplified block diagram illustrating playback circuitry including a decode path according to the present invention. In FIG. 5, a read head 72 detects magnetic transitions on the rotating magnetic recording medium 70, and provides the same to a preamplifier circuit as is conventional. The amplified read signals are filtered in analog and/or digital filtering means 74 and the filtered signals provided to a Viterbi detector system 76 generally as described previously. Additional details of the read channel decoding, etc. are omitted so as not to obscure the present invention. Data from the Viterbi detector 76 is input to a serial to parallel converter 78 which in turn assembles a 25-bit quantity indicated by 80. This is the rate 24/25 code word described above with reference to FIG. 4. The high order nibble bits 24:20 of code word 80 are concatenated with bits 11:8 to recover the 9-bit quantity indicated by reference 82. This 9-bit quantity (A') is input to a rate 8/9 RLL decoder 84 to recover the original byte A of user data. User bytes A, B and C are concatenated in a register 86 as illustrated. The resulting 3-byte quantity is provided to descrambler 88 and then the descrambled data is input to a parallel to serial convertor 90. The serial data stream output from the converter 90 is provided to the controller/ECC process 92, thereby completing the decoding path.

The rate 8/9 RLL decoder 84 of FIG. 5 can be implemented by any appropriate apparatus or methodology, for example a look-up table or ASIC logic. One example of such a decoder implements the following logic equations...

TABLE 2

| Rate 8/9 Decoder Logic Equations |
|---|
| a0 = !y0 && !y1 && y4; |
| fig = y0 + y1; |
| x0 = (a0 && y5) + ( (y0 && y1) + (y1 && y3 && y4) ); |
| x1 = (a0 && y6) + ( (y1 && y2 && !y3) + ( y0 && y2 ) + (y1 && y2 && y4); |
| x2 = (a0 && y7) + ( (y1 && y2 && y3 && y4) + ( y0 && !y1) + ( y0 && y1 && y3) ); |
| x3 = (a0 && y8) + ( (!y0 && y1 && y4) + (y0 && y4) ); |
| x4 = fig && y5; |
| x5 = fig && y6; |
| x6 = fig && y7; |
| x7 = fig && y8; | where y[8:0] is the said first 9 bits of the input word, x[7:0] is the said recovered 8-bit symbol, ! is the complement operator, && is the logical AND operator, and + is the logical OR operator. The decoder "undoes" the rate 8/9 encoding described above.

Error Sequence Analysis

A typical sequence of bytes will be:
A1'[8:4] B1[7:0] A1'[3:0] C1[7:0] A2'[8:4] B2[7:0] A2'[3:0] C2[7:0] . . .

The minimum distance error events have the error sequences: {+0+0+0+0 ... } or {+−+−+− ...}, where "+" means that a "−" bit is flipped to a "+" (in magnetization, or write current) and a "−" means that a "+" bit is flipped to a "−" bit. "0" means that nothing was in error. Because of the 1+D 2 modulo 2 postcoder, errors will occur at the output of the postcoder only at the start and end of an error sequence in each interleave. In the case of the "+0+ ..." sequence, there will be 2 bits in error (e 000 ... 000 e), where "e" means error and "0" means no error. In the case of the "+−+− ..." type error, 4 total bits will be in error at the output of the postcoder (e e 000 ... 000 e e). Consequently, the first type of error event can corrupt at most 2 bytes and the second type can corrupt at most 4 bytes (with a worst-case alignment of code words and error event).

One of the goals of the runlength code is to limit the span of these long error events, such that no more than one byte per ECC interleave is corrupted by a single minimum-distance error event. In the case of the 24/25 code described above, a minimum distance error event will corrupt anywhere from 1 to 4 bytes, with a total error span of not more than 4 bytes. Therefore, a four way interleaved ECC system will work with the described 24/25 code.

Regarding the "+0+0 ..." type error event: worst case transition spacing in one interleave could result in a minimum-distance error event starting in byte A1' and ending in A2'. Because we are certain of a transition in each interleave of the first nibble of A2', the error cannot span into B2. This error event is possible only if there are all intervening non-transitions (zeros in the RLL code) in the interleave. If it ends in A2', an ECC span of 4 bytes is required to prevent corrupting more than one byte per interleave. However, only two bytes are corrupted. Thus, even though the "T" constraint is quite large, the impact on ECC is modest.

Regarding the "+−+− ... " type error event: since there must be a globally transition free pattern to support this error event, we know that either nibble of A' will terminate the event. A worst case analysis shows that an error could begin in the last bit of B 1 and propagate into the first nibble of A2. This error event could corrupt up to 4 bytes, and once again limit the span to less to 4 bytes. However, most typical error events of this type will corrupt fewer bytes.

Having described and illustrated the principles of the invention in a preferred embodiment thereof, it should be apparent that the invention can be modified in arrangement and detail without departing from such principles. We claim all modifications and variation coming within the spirit and scope of the following claims.

We claim:

1. A method for generating a rate 24/25 RLL (0,14/13) channel code for use in a digitally detected magnetic recording and playback system to encode a series of user digital data bits, the method comprising the steps of:

forming a series of at least 24 bits of the user data bits;
   rate 8/9 encoding a first 8 bits of the series so as to form an encoded 9-bit codeword;
   partitioning the encoded 9-bit codeword so as to form a first, 5-bit nibble and a second, 4-bit nibble;
   sequentially concatenating the first nibble, a second 8-bits of the user data bits, the second nibble, and a third 8-bits of the user data bits so as to form a 25-bit codeword responsive to the 24 bits of user data.

2. A method according to claim 1 further comprising converting the 25-bit codeword into a serial bitstream and recording the serial bitstream upon a magnetic data storage medium.

3. A method according to claim 1 wherein the user digital data comprises a series of three bytes, and said encoding step includes rate 8/9 encoding a first one of the user bytes, and said concatenating step includes sequentially concatenating the first nibble, a second one of the user digital data bytes, the second nibble, and a third one of the user digital data bytes thereby forming the said 25-bit codeword responsive to the said three bytes of user data.

4. A method according to claim 3 wherein said rate 8/9 encoding step includes an interleave constraint within the first five bits of each codeword.

5. A method according to claim 3 wherein said rate 8/9 encoding step is constrained so as to ensure the occurrence of at least a single logic one within the last four bits of each codeword.

6. A method according to claim 3 wherein said rate 8/9 encoding step is constrained so as to ensure the occurrence of at least as single logic one within the last four bits of each codeword.

7. A method according to claim 3 wherein said rate 8/9 encoding step comprises a rate 8/9 RLL (0,6/5) encoding.

8. A method according to claim 3 wherein said rate 8/9 encoding step includes looking up a corresponding codeword in a predetermined lookup table responsive to the user data byte being encoded.

9. A method according to claim 1 further comprising converting the 25-bit codeword into a serial bitstream and preceding the serial bitstream according to 1/(1+DA2) partial response precoding and then recording the precoded bitstream upon a magnetic data storage medium.

10. A method according to claim 9 further comprising playing back the recorded bitstream from the magnetic data storage medium so as to recover recorded information;

recovering the recorded codewords;
   unprecoding the recovered codewords according to (1+DA2) to form a 25-bit decoded signal;
   partitioning the decoded signal into a first nibble, a second byte, a second nibble and a third byte;
   concatenating the first nibble and the second nibble to recover a 9-bit codeword; and
   rate 8/9 RLL decoding the recovered 9-bit codeword to form a first byte.

11. A method according to claim 10 and further comprising:

sequentially concatenating the first, second and third bytes to form a parallel read data word; and then converting the parallel read data word to a serial bit stream of read data.

12. A rate 24/25 modulation code for a magnetic recording channel comprising the bit sequence:

A8:A4.B7:B0.A3:A0,C7:C0 where A8:A0 comprise a rate 8/9 codeword encoding a first 8-bit user byte and B and C are second and third 8-bit user bytes, respectively, of a three byte sequence of user data to be stored through the said magnetic recording channel.

13. A rate 24/25 modulation code according to claim 12 wherein the rate 8/9 codeword A8:A0 includes at least one transition in each interleave in the first 5-bit nibble A8:A4.

14. A rate 24/25 modulation code according to claim 13 wherein the rate 8/9 codeword A8:A0 includes at least one global transition in each nibble.

15. A rate 24/25 modulation code according to claim 12 wherein the rate 8/9 codeword is characterized by RLL (0,3).

16. A modulation code encoder for generating a rate 24/25 modulation code to encode digital data bits in a magnetic recording system comprising:

a serial to parallel converter for receiving a serial stream of input data bits and forming a three-byte input word;

a rate 8/9 encoder arranged for encoding a first byte of the input word to form a 9-bit codeword; and a register coupled to the serial-to-parallel converter to receive a second byte and a third byte of the input word, and coupled to the rate 8/9 encoder to receive the 9-bit codeword;

the register being arranged to form the rate 24/25 codeword by concatenating the following bits in the following sequence: A[8:4] B A[3:0] C, where A is the 9-bit codeword, B is the second byte of the input word and C is the third byte of the input word.

17. A rate 24/25 modulation encoder according to claim 16 wherein the rate 8/9 encoder implements an RLL (0,3) code.

18. A rate 24/25 modulation encoder according to claim 16 wherein the rate 8/9 encoder implements an interleave restriction.

19. A rate 24/25 modulation encoder according to claim 16 wherein the rate 8/9 encoder implements the following logic equations:

b0=!x0&&!x1 &&!x2 &&!x3;

e0=!x4&&!x5 &&!x6 &&!x7;

y0=!e0&&((!x0 && x2)+(x2 &&!x3)+(x0 && x2)+(x0 &&!x1));

y1=!e0 &&(x0+!x2);

y2=e0+b0+x1;

y3=e0+b0+x2;

y4=(e0 &&!b0)+x3;

y5=((e0 &&!b0)&& x0)+x4;

y6=((e0 &&!b0)&& x1)+x5;

y7=((e0 &&!b0)&& x2)+x6; and y8=((e0 &&!b0)&& x3)+x7+(e0 && b0), where x[7:0] is the said first byte of the input word, y[8:0] is the said 9-bit codeword, ! is the complement operator, && is the logic AND operator, and + is the boolean OR operator.

20. A decoder for decoding a rate 24/25 modulation encoded serial stream of read data recovered from a magnetic recording medium, the decoder comprising:

a serial to parallel converter for receiving the serial stream of read data and framing a 25-bit word;

a rate 8/9 RLL decoder arranged for decoding a first 9 bits of the word to recover an 8-bit symbol; and a register coupled to the serial-to-parallel converter to receive a remaining 16 bits of the word, and coupled to the rate 8/9 encoder to receive the 8-bit symbol;

the register being arranged to form a 24-bit decoded word by concatenating the following bits in the following sequence: A B C, where A is the said 8-bit symbol, B is the second byte of the input word and C is the third byte of the input word.

21. A decoder according to claim 20 wherein the rate 8/9 RLL decoder implements the following logic equations:

a0=!y0 &&!y1 && y4;

flg=y0+y1;

x0=(a0 && y5)+((y0 && y1)+(y1 &&y3 && y4));

x1=(a0 && y6)+((y1 && y2 &&!y3)+(y0 && y2)+(y1 &&y2 && y4);

x2=(a0 && y7)+((y1 && y2 && y3 && y4)+(y0 &&!y1)+(y0 && y1 && y3));

x3=(a0 && y8)+((!y0 && y1 && y4)+(y0 && y4));

x4=flg && y5;

x5=flg && y6;

x6=flg && y7;

x7=flg && y8;

where y[8:0] is the said first 9 bits of the input word, x[7:0] is the said recovered 8-bit symbol, ! is the complement operator, && is the logical AND operator, and + is the logical OR operator.

* * * * *